United States Patent
Bonbrake et al.

(10) Patent No.: US 9,658,044 B2
(45) Date of Patent: May 23, 2017

(54) METHOD AND APPARATUS FOR EXECUTING A WEAPON SAFETY SYSTEM UTILIZING EXPLOSIVE FLUX COMPRESSION

(71) Applicant: Raytheon Company, Waltham, MA (US)

(72) Inventors: Tim B. Bonbrake, Tuscon, AZ (US); Kim L. Christianson, Oro Valley, AZ (US); Henri Y. Kim, Tuscon, AZ (US)

(73) Assignee: Raytheon Company, Waltham, MA (US)

(*) Notice: Subject to any disclaimer, the term of this patent is extended or adjusted under 35 U.S.C. 154(b) by 100 days.

(21) Appl. No.: 14/636,449

(22) Filed: Mar. 3, 2015

(65) Prior Publication Data
US 2016/0258730 A1 Sep. 8, 2016

(51) Int. Cl.
*F42C 11/04* (2006.01)
*H03K 3/53* (2006.01)
*H01L 41/113* (2006.01)
*H02N 2/18* (2006.01)

(52) U.S. Cl.
CPC .............. *F42C 11/04* (2013.01); *H03K 3/53* (2013.01); *H01L 41/113* (2013.01); *H02N 2/18* (2013.01)

(58) Field of Classification Search
CPC ......... F42C 11/04; H01L 41/113; H02N 2/18; H03K 3/53; H03K 3/45
USPC ....................................................... 102/209
See application file for complete search history.

(56) References Cited

U.S. PATENT DOCUMENTS

| | | | |
|---|---|---|---|
| 4,655,139 A * | 4/1987 | Wilhelm | F42C 19/095 102/309 |
| 5,059,839 A * | 10/1991 | Rose | F42B 12/36 310/10 |
| 5,197,279 A * | 3/1993 | Taylor | H02N 11/006 60/200.1 |
| 5,859,383 A * | 1/1999 | Davison | C06B 25/34 102/307 |
| 5,904,207 A * | 5/1999 | Rubbo | E21B 33/1212 166/123 |
| 6,598,534 B2 * | 7/2003 | Lloyd | F41H 11/02 102/491 |

(Continued)

FOREIGN PATENT DOCUMENTS

CN 102468784 A 5/2012

*Primary Examiner* — Michelle R Clement
(74) *Attorney, Agent, or Firm* — Renner, Otto, Boisselle & Sklar, LLP (57) ABSTRACT

There is a firing and arming system, such as an activation system, of a munition for quickly and accurately activating a warhead or a propulsion system of the activation system. An initiator interface of the activation system activates the warhead or propulsion system. At least one power source is included in the activation system to provide the initial power for activation of the initiator interface and subsequent activating of the respective warhead or propulsion system. Logic elements are communicatively disposed between the at least one power source and a flux compression generator circuit to control activation of the generator. The flux compression generator circuit is at least partially detonated to transform current received from the at least one power source into sufficient current for activating the initiator interface.

11 Claims, 6 Drawing Sheets

(56) References Cited

U.S. PATENT DOCUMENTS

| | | | | |
|---|---|---|---|---|
| 6,779,462 B2* | 8/2004 | Lloyd | F42B 12/58 | 102/475 |
| 6,910,423 B2* | 6/2005 | Lloyd | F42B 12/58 | 102/476 |
| 6,973,878 B2* | 12/2005 | Lloyd | F41H 11/02 | 102/475 |
| 7,334,523 B2* | 2/2008 | Lucas | F42B 3/18 | 102/202.7 |
| 7,560,855 B2* | 7/2009 | Baird | H02N 2/183 | 310/339 |
| 7,621,222 B2* | 11/2009 | Lloyd | F42B 12/24 | 102/497 |
| 7,624,682 B2* | 12/2009 | Lloyd | F42B 12/06 | 102/497 |
| 7,999,445 B2* | 8/2011 | Baird | H02N 2/183 | 310/319 |
| 8,008,843 B2* | 8/2011 | Baird | H02K 99/10 | 310/339 |
| 8,188,636 B2* | 5/2012 | Baird | H03K 3/45 | 310/319 |
| 8,487,506 B2* | 7/2013 | Baird | H03K 3/45 | 310/300 |
| 8,578,831 B2* | 11/2013 | Adler | F41H 11/16 | 102/403 |
| 8,723,390 B2* | 5/2014 | Corbett | H03K 3/38 | 310/23 |
| 9,476,668 B1* | 10/2016 | Grace | F41B 6/003 | |
| 2003/0019386 A1* | 1/2003 | Lloyd | F41H 11/02 | 102/494 |
| 2003/0029347 A1* | 2/2003 | Lloyd | F42B 12/58 | 102/489 |
| 2004/0055500 A1* | 3/2004 | Lloyd | F41H 11/02 | 102/494 |
| 2004/0200380 A1* | 10/2004 | Lloyd | F42B 12/58 | 102/497 |
| 2005/0109234 A1* | 5/2005 | Lloyd | F42B 12/32 | 102/497 |
| 2006/0086279 A1* | 4/2006 | Lloyd | F42B 12/06 | 102/497 |
| 2006/0283348 A1* | 12/2006 | Lloyd | F41H 11/02 | 102/497 |
| 2008/0012680 A1* | 1/2008 | Muelleman | F41B 6/006 | 336/212 |
| 2009/0152989 A1* | 6/2009 | Baird | H02N 2/183 | 310/339 |
| 2009/0205529 A1* | 8/2009 | Lloyd | F42B 12/24 | 102/476 |
| 2009/0224610 A1* | 9/2009 | Fuks | F42B 12/36 | 307/108 |
| 2009/0256447 A1* | 10/2009 | Baird | H02N 2/183 | 310/339 |
| 2011/0006614 A1* | 1/2011 | Baird | H02K 99/10 | 307/106 |
| 2011/0006642 A1* | 1/2011 | Baird | H02N 2/183 | 310/339 |
| 2012/0019078 A1* | 1/2012 | Baird | H02K 99/10 | 307/106 |
| 2012/0073426 A1* | 3/2012 | Adler | F41H 11/16 | 89/1.13 |
| 2012/0128493 A1* | 5/2012 | Shelley | B64D 27/10 | 416/146 R |
| 2012/0242192 A1* | 9/2012 | Baird | H02K 99/10 | 310/319 |
| 2014/0191614 A1* | 7/2014 | Gerhart | H01L 37/02 | 310/306 |
| 2014/0227548 A1* | 8/2014 | Myrick | C06B 45/30 | 428/570 |
| 2014/0252921 A1* | 9/2014 | Burgener, II | H02N 11/002 | 310/358 |
| 2015/0059608 A1* | 3/2015 | McLean | F42B 12/16 | 102/217 |
| 2016/0032904 A1* | 2/2016 | Kaplan | G21C 1/00 | 60/698 |

* cited by examiner

METHOD AND APPARATUS FOR EXECUTING A WEAPON SAFETY SYSTEM UTILIZING EXPLOSIVE FLUX COMPRESSION

FIELD OF THE INVENTION

The invention relates generally to arming and firing systems for munitions, such as missiles and other projectiles.

DESCRIPTION OF THE RELATED ART

Munitions deployed from a deployment system often include at least one arming and firing system, also herein referred to as an activation system. The arming and firing system may be provided for arming and/or firing a warhead of the munition or for arming and/or firing a propulsion system of the munition, such as a motor. The munition, for instance a bomb, a missile, a smart bomb, or another projectile, is typically deployed some distance from a target. The arming and firing system is typically activated, including arming and/or firing, after deployment of the munition from the deployment system. For example a rocket motor of a deployed munition may be armed and fired, or a warhead of the deployed munition may be armed and fired, after a predetermined distance between the munition and the deployment system has been reached, or after the deployed munition has reached a predetermined distance from a target.

The warhead or rocket motor is often ultimately fired by an initiator interface that is powered by its respective activation system. A typical initiator interface, such as an exploding foil initiator, is initiated, such as being detonated, upon coming in contact with high amperage current, which may be greater than 1,500 amperes. A typical activation system often includes at least two independent safety logic elements, each of which is independently activated at a particular time or in response to a particular event to enable the high amperage current to reach the initiator interface.

SUMMARY OF THE INVENTION

The present invention provides an activation system of a munition for quickly and accurately arming and firing a warhead or a propulsion system of the activation system. An initiator interface of the activation system activates the warhead or propulsion system. At least one power source is included in the activation system to provide the initial power for activation of the initiator interface and subsequent activation of the respective warhead or propulsion system. Logic elements are communicatively disposed between the at least one power source and a flux compression generator circuit to control activation of the generator. The flux compression generator circuit is at least partially detonated to transform current received from the at least one power source into sufficient current for activating the initiator interface.

According to one aspect of the invention, there is an activation system of a munition for activating a warhead or a propulsion system of the munition. The activation system includes an initiator interface that activates the warhead or the propulsion system, a power source, first and second logic elements, and a flux compression generator circuit powered by the power source and communicatively connected to the logic elements and to the initiator interface. Activation of the flux compression generator circuit via switching of the logic elements causes current to flow from the flux compression generator circuit to the initiator interface, resulting in activation of the initiator interface and subsequent activation of the respective warhead or propulsion system.

The flux compression generator circuit may include an inductor that receives current from the power source upon switching of the first logic element, and a circuit detonator that is activated by the power source to detonate upon switching of both the first logic element and the second logic element, causing shorting of the inductor and increasing current in the inductor.

The initiator interface may be an exploding foil initiator.

The flux compression generator circuit may include a physically-activated shorting switch, wherein current does not flow from the flux compression generator circuit to the initiator interface until switching of the physically-activated shorting switch.

The physically-activated shorting switch may be automatically activated in response to detonation of a portion of the flux compression generator, the detonation being caused by the activation of the flux compression generator.

The flux compression generator circuit may include a physically-activated shorting switch communicatively coupled between the inductor and the initiator interface, wherein the flux compression generator circuit is configured to cause current to flow from the flux compression generator circuit to the initiator interface upon switching of the physically-activated shorting switch.

Activation of the flux compression generator circuit may cause subsequent activation of the initiator interface within less than thirty microseconds after activation of the flux compression generator circuit.

According to another aspect of the invention, there is an activation system of a munition for activating a warhead or a propulsion system of the munition. The activation system includes an initiator interface that activates the warhead or the propulsion system, a circuit detonator including explosive material encased by a detonator housing, and an inductor coil wrapped about the detonator housing and about a longitudinal coil axis between opposed first and second longitudinal ends of the inductor coil. The inductor coil has lead turns at the first longitudinal end of the coil and lag turns at the second longitudinal end of the coil. Detonation of the explosive material causes the detonator housing to expand radially outwardly, causing the inductor coil to short and causing current in the inductor coils to increase and to be directed into the lag turns of the inductor coil until the subsequently increased current is released from the lag turns into the initiator interface, thus activating the initiator interface.

The circuit detonator may be disposed radially inwardly of the lead turns of the inductor coil and is longitudinally spaced along the longitudinal coil axis from the lag turns of the inductor coil.

The initiator interface may be an exploding foil initiator.

The inductor coil may include nine turns.

The inductor coil may include six lead turns and three lag turns.

The lag turns and the initiator interface may be electrically separated by a switch.

The switch may be a physically-activated switch that is opened via explosive force caused by detonation of the circuit detonator.

The switch may be disposed at a longitudinal end of the circuit detonator adjacent the lag turns.

The activation system may include a power source and first and second logic elements communicatively connected to the inductor coil and/or the circuit detonator, wherein the inductor receives current from the power source upon switching of the first logic element, and the circuit detonator receives current from the power source to trigger its detonation upon switching of both the first and second logic elements.

The activation system may include a timing element communicatively connected to the first and second logic elements, and configured to switch the second logic element after a predetermined period of time has passed after the switching of the first logic element.

According to yet another aspect of the invention, there is a method of activating a warhead or a propulsion system of a munition. The method includes the steps of switching a first logic element of the munition to allow the flow of current from a first power source of the munition to an inductor coil of the munition. The method further includes subsequent to the switching of the first logic element, switching a second logic element of the munition to allow the flow of current from the first power source or a second power source of the munition to a circuit detonator of the munition to trigger radially outward detonation of a detonator housing of the circuit detonator. The method further includes shorting turns of the inductor coil via physical interaction of the inductor coil with a portion of the detonated detonator housing. The method further includes activating an explosive foil initiator of the munition that is communicatively connected to the warhead or propulsion system via flow of current released from the inductor coil, wherein the release is caused by the detonation of the circuit detonator.

The method may further include the step of activating a physically-activated switch of the munition connected between the inductor coil and the explosive foil initiator to allow the flow of current from the inductor coil to the explosive foil initiator.

The method may further include the step of detonating the circuit detonator when the inductor coil has stored therein current in excess of 2,000 amperes.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the disclosure.

DETAILED DESCRIPTION

An activation system of a munition, such as a weapon activation system of a missile, is configured to timely activate another associated system of the munition, such as a propulsion system or a warhead. The activation system provides high amperage current to an initiator interface of the activation system, such as an exploding foil generator, for subsequently detonating the warhead or firing the propulsion system, for example. The high amperage current is quickly generated and released to the initiator interface to accurately control the detonation of the warhead or firing of the propulsion system.

The activation system does not require the use of a pre-charged capacitance element to directly release the necessary high amperage current to the initiator interface. Rather, the activation system uses a flux compression generator circuit, such as an explosive flux compression generator to generate high amperage current from a low amperage seed current.

In conventional activation systems using a pre-charged capacitance element to directly charge an associated initiator interface, a large amount of time may be required to charge the capacitance element. Accordingly, a conventional munition using a capacitance element to directly initiate the initiator interface may not have enough time, such as between pre-charge and reaching the target, for the capacitance element to be adequately charged.

In an opposite scenario, the conventional munition may fly about for a long period of time with the capacitance element merely holding the high amperage charge, but there may not yet be a need to release the charge to the initiator interface. In such case, the charge in the capacitance element may need to be continually maintained to account for current decay if the charge in the capacitance element is not timely released.

Further, when charging the capacitance element in the conventional system to the high amperage current required to initiate the associated initiator interface, and when maintaining the charge in the capacitance element, high current is proportionately drawn from the associated munition. For example, current may be drawn from a transformer which may also power other components of the associated munition, such as a guidance computer. In such case, the associated guidance computer may be caused to reset due to the current draw required to charge or maintain charge of the capacitance element. Consequently, temporary loss of guidance to the active munition may occur, hindering with accurate flight of the munition.

Capacitance elements for storing high amperage current also are often very fragile and may break from impact, vibration, or even a bird strike of the associated munition. Breakage may lead to, for example, unintended release of the stored current and an accidental detonation of the associated warhead, or even a failure to release the stored current and no detonation of the warhead. Further, these capacitance elements are often large in size and may take up valuable real estate in a munition having minimal size and/or weight requirements.

On the other hand, the exemplary activation system of the invention may avoid such fallbacks. Due to the speed and efficiency through which the exemplary activation system of the invention may generate high amperage to synchronously arm and fire the activation system, subsequently activating the initiator interface, such arming and firing may occur closer to a predetermined target without the need for a munition of the invention to fly about armed and awaiting a firing command. And without the use of a capacitance element to directly initiate the initiator interface, the user may further avoid the negative aspects of such capacitance elements, such as fragility, size, and pre-charge time.

Figure 1:
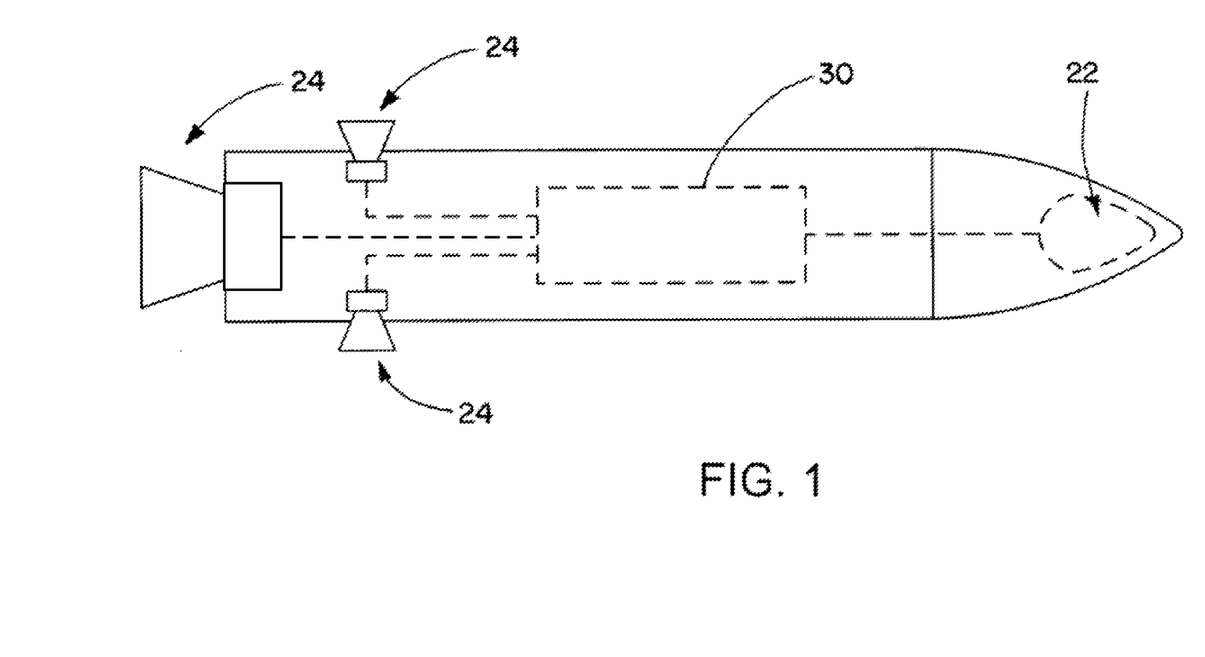
FIG. 1 is a schematic view of a munition including an arming and firing system according to the invention.
Figure 2:
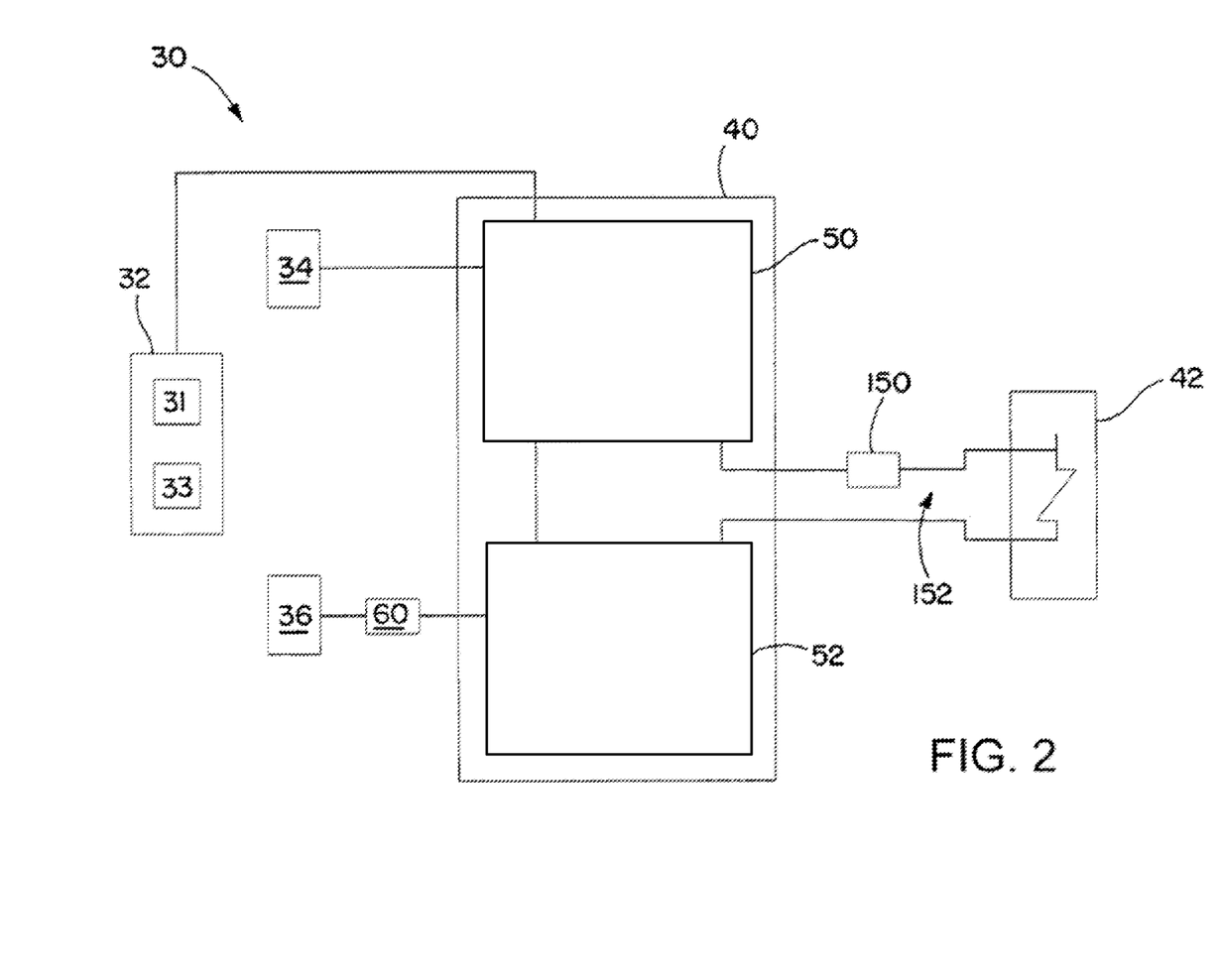
FIG. 2 is a schematic view of a munition arming and firing system according to the invention.

Accordingly, an exemplary arming and firing system according to the invention, such as the activation system 30, is shown schematically in FIGS. 1 and 2 for use in an exemplary munition 20. The activation system 30 is communicatively coupled to both a warhead 22 and a propulsion system 24, although in other embodiments the activation system 30 may only be coupled to one of the warhead 22 or the propulsion system 24. As shown in FIG. 2, the activation system 30 includes a power source 32, independent logic elements 34 and 36, a flux compression generator circuit 40, and an initiator interface 42.

Generally, a fire command must be received by the activation system 30 to activate the synchronous arming and firing of the flux compression generator circuit 40, and thus arming and firing of the activation system 30. The fire command may be received from a control interface internal or external to the munition 20. In response to the fire command, the power source 32 and independent logic elements 34 and 36 are configured to enable the synchronous arming of the flux compression generator circuit 40, hence arming the activation system 30.

The logic elements 34 and 36 and the flux compression generator circuit 40 are configured to timely and accurately provide high current from the logic elements 34 and 36 to the initiator interface 42. Both the first logic element 34 and the second logic element 36 must be timely activated to enable respective timely activation of portions of the flux compression generator circuit 40. After arming, the flux compression generator circuit 40 is automatically fired activating subsequent activation of the initiator interface 42, thus firing the activation system 30 and detonating the warhead 22 or firing the propulsion system 24.

As depicted in FIG. 1, the power source 32 includes independent power sub-sources 31 and 33 that are provided to independently power distinct flux generation and compression generation portions 50 and 52 of the flux compression generator circuit 40, also herein referred to as the EFCG circuit 40, such as an explosive flux compression generator. In other embodiments, a single power sub-source may be configured to provide power to each of the flux generation portion 50 and compression generation portion 52.

For example, the first power sub-source 31 is provided to send power to the flux generation portion 50 of the EFCG circuit 40 once the first logic element 34 is activated. The first power sub-source 31 may be any suitable power source, such as a capacitance element, such as a capacitor. For example, the first power sub-source 31 may be capacitor capable of storing and releasing approximately 28 volts of energy. In some embodiments, a voltage booster may be utilized, for example, to increase an approximately 28 volt release to an approximately 100 volt release.

The second power sub-source 33 is provided to send power through an activated second logic element 36 to the compression portion 52 of the EFCG circuit 40. The second power sub-source 33 may be any suitable power source, such as a capacitor, battery, etc.

The first and second logic elements 34 and 36 may be any suitable devices capable of allowing power to move from the power sources 32 to the EFCG circuit 40. As shown, the first and second logic elements 34 and 36 function as an "AND" function, where both are required to be activated. And moreover, the first logic element 34 and second logic element 36 must be activated in a particular order. The first logic element 34 must be activated to enable arming of the flux generation portion 50 prior to the activation of the second logic element 36 to enable firing of the compression generation portion 52, to be discussed further.

The EFCG circuit 40 is powered by the power source 32 and is communicatively coupled between the logic elements 34 and 36 and the initiator interface 42. As mentioned, activation of the EFCG circuit 40 requires switching of the logic elements 34 and 36 to cause current to flow from the EFCG circuit 40 to the initiator interface 42. To achieve this transfer of energy, the EFCG circuit 40 requires proper synchronous and timely activation of the flux and compression generation portions 50 and 52 to enable high amperage current to be generated in the EFCG circuit 40. The same synchronous and timely activation is required to enable release of the high amperage current from the EFCG circuit 40 to the initiator interface 42.

Figure 3:
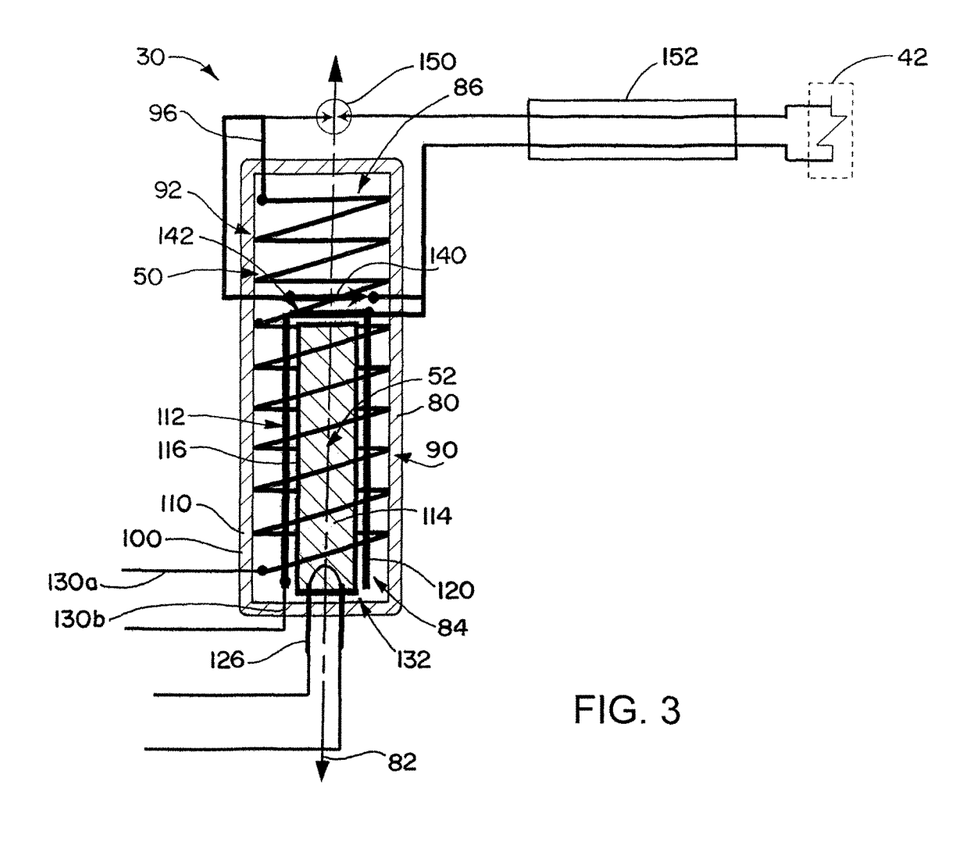
FIG. 3 is a partial schematic view of an arming and firing circuit of the system of FIG. 1.
Figure 4:
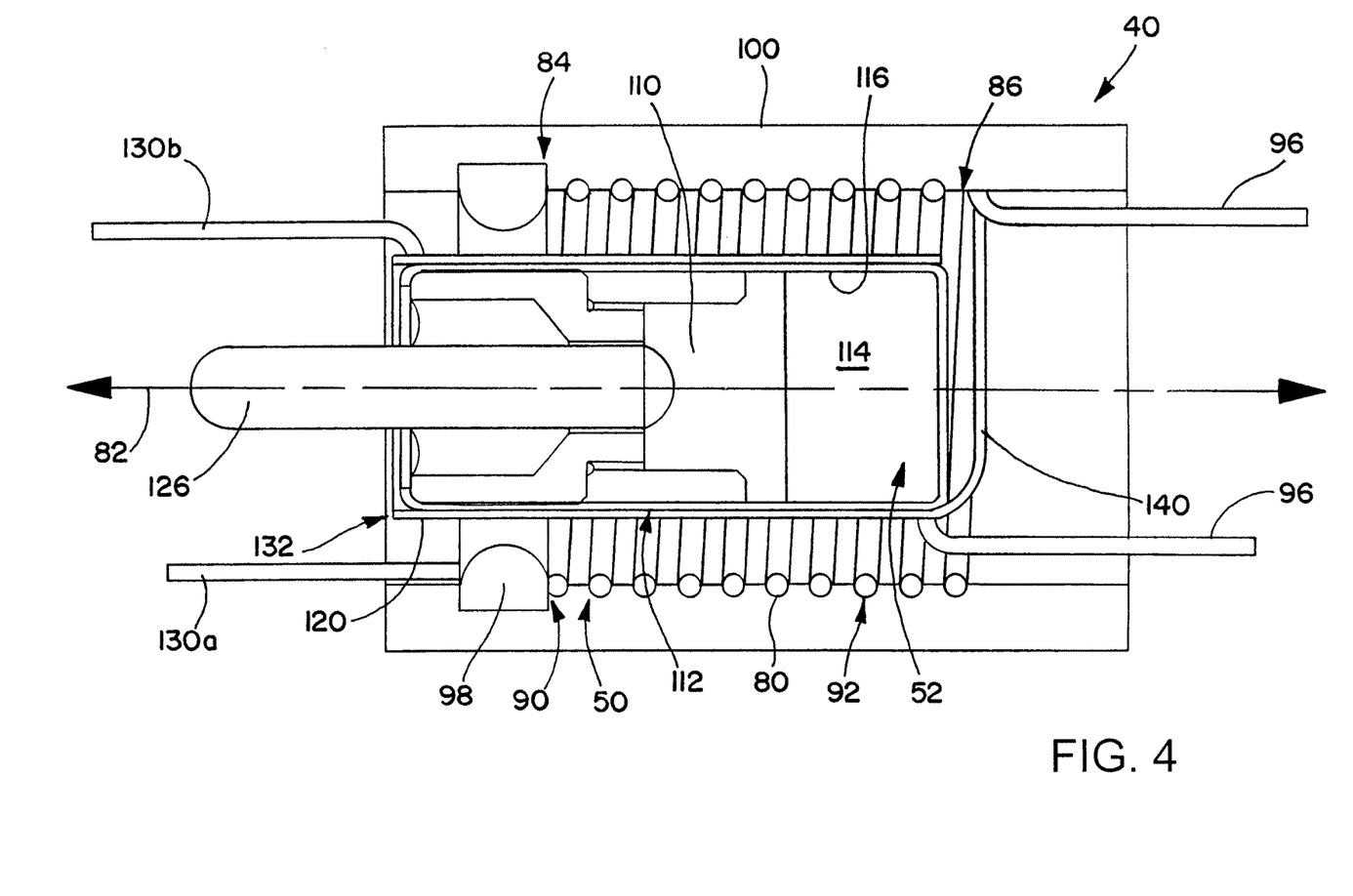
FIG. 4 is a partial cross-section side view of the circuit of FIG. 2.

Turning to FIGS. 2-4, the EFCG circuit 40 is shown separated from the remainder of the activation system 30. The flux generation portion 50 provides for magnetic flux energy that will be compressed, such as increased, to generate firing energy for the initiator interface 42. The compression generation portion 52 detonates to cause increase in the current stored in the flux generation portion 50. The compression generation portion 52 is initiated with a delay in regards to the flux generation portion 52. This is done to allow the flux generation portion 50 time to obtain peak value of current for being compressed via detonation of the compression generation portion 52.

To achieve the aforesaid delay, a timing element 60 (FIG. 1) is communicatively coupled to the first and second logic elements 34 and 36, and for example to either of the first or second logic elements 34 and 36. The timing element 60 is configured to activate the second logic element 36 after the flux generation portion 50 has reached peak energy storage, such as a current high enough to be compressed thereby generating a higher current transfer to the initiator interface 42.

The timing element 60 may be configured to switch the second logic element 36 after a predetermined time in which it is known that the flux generation portion 50 will reach its peak energy storage. In other embodiments, the timing element 60 may not enable the second logic element 36 to be activated, but may enable the compression generation portion 52 to be activated. In even other embodiments, the timing element 60 may be omitted. In such case, any other suitable method may be used to ultimately delay activation of the compression generation portion 52 until such time that the flux generation portion 50 has reached its peak energy storage. For example, a control interface may be communicatively coupled to the EFCG circuit 40 and the power source 32, and be configured to enable transfer of power from the power source 32 to the compression generation portion 52 only after a predetermined time period or when the control interface senses a predetermined energy is reached in the flux generation portion 50.

Turning again to FIGS. 2-4, the flux generation portion 50 includes an inductor 80, such as a coiled wire, disposed about part of the compression generation portion 52. The coiled wire may be any suitable wire capable of passing and storing high current. The inductor 80 includes a plurality of coils disposed about a central longitudinal coil axis 82 of the compression generation portion 52. The inductor 80 extends along the longitudinal coil axis 82 between opposed first and second longitudinal ends 84 and 86 of the inductor 80. As shown, each of the coils has the same diameter and the coils are each equally longitudinally spaced from one another. Though in other embodiments, some of the coils may have relatively different diameters and/or be unequally longitudinally spaced from one another.

Figure 5:
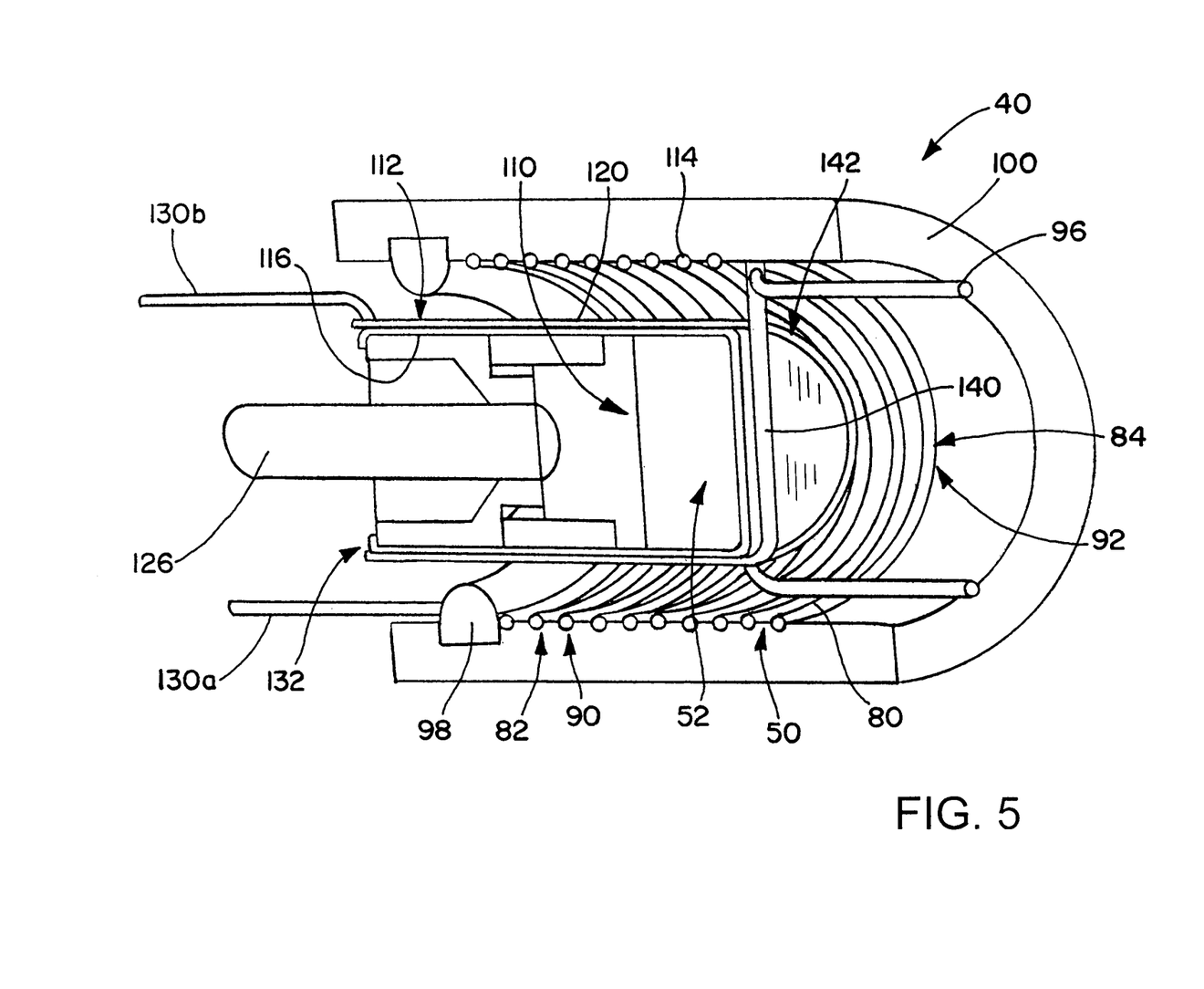
FIG. 5 is a partial cross-section isometric view of the circuit of FIG. 2.

The inductor 80 includes both lead turns 90 disposed at the first longitudinal end 84, which is a proximal end relative to the compression generation portion 52, and lag turns 92 disposed at the second longitudinal end 86, which is a distal end relative to the compression generation portion 52. The lead and lag turns 90 and 92 are communicatively connected together in a unitary inductor 80, although in other embodiments the lead and lag turns 90 and 92 may be separate but interconnected portions. The lag turns 92 are coupled to the initiator interface 42 via one or more output wires 96, while the lead turns 90 are coupled to a linking element, such as a crowbar ring 98 (FIGS. 4 and 5).

Both the flux generation portion 50 and the compression generation portion 52 are disposed within a housing 100. The housing 100 may be made of any suitable material, such as plastic. The inductor 80 is maintained in a position with the longitudinal coil axis 82 extending through the center of the inductor coil 80 via the housing 100. The housing 100 also maintains the lead turns 90 about a circuit detonator 110 of the compression generation portion 52.

The circuit detonator 110 of the compression generation portion 52 is disposed radially inwardly of the lead turns 90 and longitudinally spaced along the longitudinal coil axis 82 from the lag turns 92. As shown, the inductor coil 80 includes nine total turns, having six lead turns 90 and three lag turns 92. Although other numbers of turns may be utilized, the six lead turns 90 and three lag turns 92 are preferred, along with the relative size of the circuit detonator 110, to provide the necessary high output current to initiate the initiator interface 42.

The circuit detonator 110 is generally cylindrical and approximately 0.10 inches in diameter to approximately 0.30 inches in diameter, and preferably approximately 0.25 inches in diameter. The circuit detonator 110 is also approximately 0.3 inches in length to approximately 0.7 inches in length, and preferably approximately 0.5 inches in length along the central longitudinal coil axis 82. Although in other embodiments, the circuit detonator 110 may have any suitable diameter or length, and be of any suitable shape.

The circuit detonator 110 includes a detonator housing 112 disposed about an explosive material 114. The explosive material 114 may be any suitable material and may include one or more different materials in some embodiments. The depicted detonator housing 112 includes an inner layer 116 made of a suitable metal that is suitable for maintaining shape of the explosive material 114 and may be chosen for its manufacturing suitability. For example, the inner layer 116 may be made of steel that can be drawn into a can shape into which liquid explosive may be poured and cured. Also included is an external sleeve, such as an armature 120, made of a metal, and preferably an electrically-conductive malleable material, such as aluminum or copper. The malleable material is also preferably one which may expand radially outwardly with minimal fracturing upon detonation of the explosive material 114 disposed radially inwardly of the armature 120.

The compression generation portion 52 of the EFCG circuit 40 is connected to the power source 32 via a detonation power input 126. The detonation power input 126 is in contact with, and preferably embedded in, the explosive material 114 of the circuit detonator 110. Accordingly, upon activation of the second logic element 36 and after a delay caused by the timing element 60, power from the power source 32 will be received at the circuit detonator 110 via the detonation power input 126, causing ignition and detonation of the explosive material 114 and of the circuit detonator 110.

The EFCG circuit 40, and particularly the flux generation portion 50, is connected to the power source 32 via additional power inputs 130a and 130b. A first flux power input 130a is connected at the proximal end 84 of the inductor 80 to the lead turns 90, and preferably to the proximal-most lead turn 90. A second flux power input 130b is connected at a corresponding proximal end 132 of the circuit detonator 110, and particularly to the external sleeve 120.

The EFCG circuit 40 also includes a shorting switch 140 connected at the distal end 86 of the inductor 80 to the lag turns 92, and preferably to the distal-most lag turn. Thus the shorting switch 140 is communicatively disposed between the lag turns 92 and the initiator interface 42. The shorting switch 140 has a default closed position closing a circuit between the flux generation portion 50 and the power source 32. Accordingly, prior to detonation of the compression generation portion 52, current moves form the power source 32, to the first flux power input 130a, through the lead and lag turns 90 and 92, and returns to the power source 32 via the second flux power input 130b, or vice versa.

The shorting switch 140 is a physically-activated shorting switch preventing current flow from the EFCG circuit 40 to the initiator interface until switching or opening of the shorting switch 140 from its default closed position to its secondary open position. The shorting switch 140 is automatically activated, such as opened, in response to detonation of the circuit detonator 110, which is in turn caused by the activation of the compression generation portion 52.

While connected at the distal end 86 of the inductor, the shorting switch 140 is disposed adjacent a distal end 142 of the detonator housing 112 placing it in proximity for being physically opened via the explosive force of the exploding circuit detonator 110. For example, the shorting switch 140 is disposed along the longitudinal coil axis 82 generally between the lead turns 90 and the lag turns 92.

The circuit detonator 110 is configured to explode radially outwardly such that the detonation progresses longitudinally along the central longitudinal coil axis 82 from the proximal end 132 to the distal end 142. Thus the shorting switch 140 is caused to open only after detonation of the proximal portion of the circuit detonator 110 has caused current in the inductor 80 to be compressed into the lag turns 92. Subsequently, opening of the shorting switch 140 enables flow of current in the lag turns 92 to flow to the initiator interface 42. Accordingly, the shorting switch 140 is a physically-activated switch communicatively disposed between the inductor 80 and the initiator interface 42, wherein the EFCG circuit 40 is configured to cause current to flow from the EFCG circuit 40 to the initiator interface 42 only upon switching of the shorting switch 140.

In other embodiments, the shorting switch 140 may be omitted. Though without the shorting switch 140, the shorted current generated may be immediately moved to the initiator interface 42 prior to completion of detonation of the circuit detonator 110. In this way, current may begin to decay and may take a longer period of time to reach the initiator interface 42, than would be the case including the shorting switch 140. In other words, inclusion of the shorting switch 140 prevents (a) current reaching the initiator interface 42 that is not great enough to initiate the initiator interface 42, and/or (b) too great of a rise time where current reaches the initiator interface 42 over a time period greater than that necessary to initiate the imitator interface 42, either of which will cause the initiator interface 42 to fail activation.

In summary, after peak storage current has been achieved in the inductor 80, detonation of the circuit detonator 110 causes one or both of (a) fragmentation of the lead turns 90 of the inductor 80 or (b) radially outward expansion of the armature 120 in response to the detonation, causing the armature 120 to short against turns of the lead turns 90, forcing current in the lead turns 90 to be moved to the lag turns 92. Seed current in the lead turns 90 is generally increased as it is compressed into the lag turns 92, and is maintained in the lag turns 92 until opening of the shorting switch 140, preventing premature decay or an increased rise time of the increased shorted current.

For example, while the inductor 80 may be capable of storing approximately 1,000 amperes of current, subsequent detonation of the compression generation portion 52 can cause the current in the inductor 80, and particularly in the lag turns 82, to be increased to greater than approximately 2,500 amperes. Further, the increase in current may occur over the duration of less than approximately one microsecond, and the entire arming and firing sequence of the activation system 30 may occur over less than approximately thirty microseconds, for example. In comparison, a conventional activation system using a capacitor for direct discharge to an associated initiator interface may require greater than thirty milliseconds, or thirty-thousand microseconds, to complete its activation sequence, which is approximately one-thousand times longer than required by the exemplary activation system 30.

Turning again to FIGS. 1 and 2, a gas discharge tube 150 is communicatively coupled between the lag turns 92 and the initiator interface 42, and a suitable communicative connection strip 152 is communicatively coupled between the gas discharge tube 150 and the initiator interface 42. The gas discharge tube 150, also herein referred to as a GDT 150, is provided to provide wave shaping of the output pulse generated by the opening of the shorting switch 140. In other embodiments, the GDT 150 may be omitted. In such case, wave shaping may not be required to provide a necessary high rise time for the output pulse.

The communicative connection strip 152 is communicatively disposed between the EFCG circuit 40 and initiator interface 42 to enable passage of the high amperage current from the lag turns 92 of the EFCG circuit 40 to the initiator interface 42. For example, the depicted communicative connection strip 152 is a stripline allowing low impedance rapid passage of high amperage current without significant decay of current during passage over the stripline.

The initiator interface 42 may be any suitable initiator device, such as an exploding foil initiator. The depicted exploding foil initiator 42, also herein referred to as an EFI 42, requires a predetermined current pulse including a great enough current quantity be received over a particular rise time for the initiator to be activated, such as detonated. Without either (a) a great enough current pulse or (b) the current delivered quickly enough, i.e., via a low enough rise time, the initiator interface 42 will not explode and thus the associated warhead will not detonate or associated propulsion system will not fire. For example, the depicted EFI 42 requires a current between approximately 1,000 and approximately 3,000 amps to be delivered over a rise-time of less than approximately thirty nanoseconds, and more preferably requires a current of at least approximately 2,000 amps to be delivered over a rise-time of less than approximately twenty nanoseconds.

In summary, the function of the exemplary activation system 30 generally provides for transforming a relatively lesser seed current received from the power source 32 into a relatively greater activation current for activation of the initiator interface 42. For example, approximately 2L/3 length of the inductor 80 is disposed about the circuit detonator 110, while approximately L/3 length of the inductor 80 is disposed longitudinally distally beyond the circuit detonator 110. The 2L/3 lead turns 90 receive seed current from the power source 32 once the first logic element 34 is activated. The seed current is quantitatively less than that necessary to initiate the initiator interface 42.

The circuit detonator 110 receives power from the power source 32 once the second logic element 36 is activated and once the timing element 60 is activated. The timing element 60 provides a delay between initial receipt of the seed current by the lead turns 90 and detonation of the circuit detonator 110, providing time for seed current stored in the lead turns 90 to reach a maximum storage capacity and hence for flux density to be at a maximum.

The subsequent detonation of the circuit detonator 110 shorts the lead turns 90 of the inductor 80. The initial short reduces the inductance in the remaining turns of the inductor 80 disposed distally along the central longitudinal coil axis 82 of the initially detonated explosive material 114. The inductance in these remaining turns is subsequently reduced as additional turns are shorted in a direction along the axis 82 from the proximal end 84 to the distal end 86. This process continues for the duration of the shock wave moving down the length of the circuit detonator 110 along the axis 82 towards the lag turns 92. The shock wave may move, for example, at a rate of approximately 6KM/sec. As a result, the 2L/3 flux of the seed current received from the power source 32 is compressed into the L/3 lag turns 92 to increase the flux density in the lag turns 92 to an increased level great enough to enable activation of the initiator interface 42.

The closed shorting switch 140 allows short circuit current to flow during compression of the inductor 2L/3 lead turns 90 into the final L/3 lag turns 92. The flow of the short circuit current is terminated or interrupted as the shorting switch 140 is physically opened via the shock wave of the detonator output. The opening of the shorting switch 140 allows the flux energy compressed into the final L/3 lag turns 92 of the inductor 80 to be released, and the coincident interruption of short circuit current causes a collapse of the magnetic field in the EFCG circuit 40, inducing a sharply rising voltage across the output of the EFCG circuit 40.

When the output voltage exceeds the threshold of the GDT 150, such as approximately 2,000 volts, break-over occurs and energy begins to flow to the initiator interface 42 over the communicative connection strip 152. Due to the use of the shorting switch 140, the current flowing to the initiator interface 42 is in the form of a large current pulse of at least approximately 2,000 amperes. Also due to the shorting switch 140, and in part to the use of the communicative connection strip 152 having a low impedance, the large current pulse is transmitted to the initiator interface with a low rise time and with minimal degradation, i.e., loss of current.

Furthermore, the necessary current pulse for activating the initiator interface 42 is only generated via activation of each of the logic elements 34 and 36 in a predetermined order, thus serving as a safety system to prevent unintended activation of the initiator interface 42. The necessary seed energy is switched into the flux generation portion 50 of the EFCG circuit 40 by activation of the first logic element 34 upon determination that the first arming safety environment has been satisfied. Subsequently, the necessary seed energy is switched into the compression generation portion 52 of the EFCG circuit 40 by activation of the second logic element 36 upon determination that the second arming safety environments have been satisfied. The compression generation portion pre-arm is provided only if it has been determined that the respective arming safety environments of both logic elements 34 and 36 have been satisfied. Preferably, the two logic elements 34 and 36 are disposed in series in the activation system 30, forming a logical "AND" function. Accordingly, the flux generation portion 50 pre-arming is totally independent of the pre-arming of the compression generation portion 52 to provide enhanced system arming and firing safety.

Figure 6:
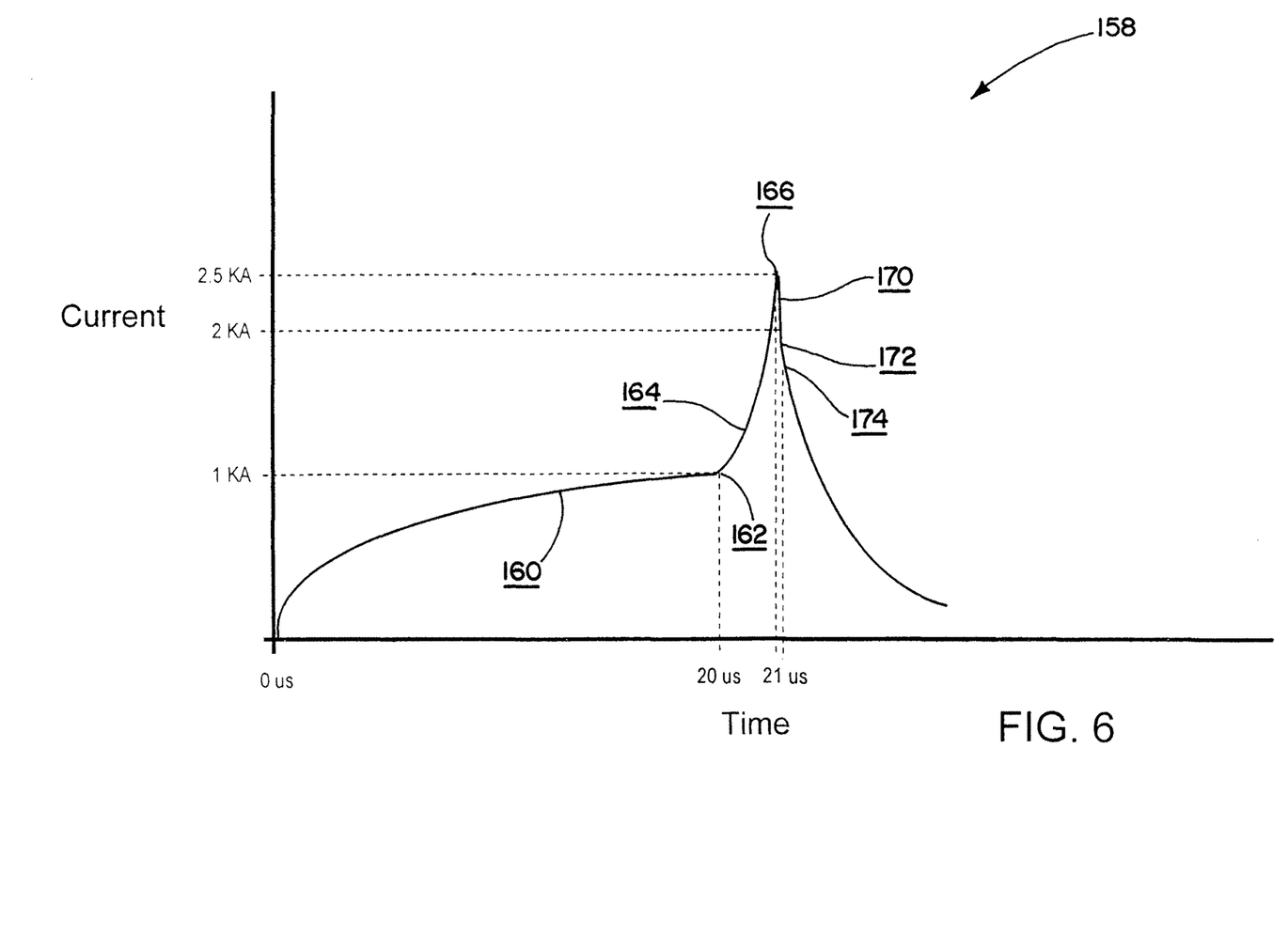
FIG. 6 is a graph showing over time the current passing through an exemplary arming and firing system according to the invention.

Referring now to FIG. 6, a graph 158 illustrates one exemplary scenario over time of the current passing through the exemplary arming and firing system 30 according to the aforementioned explanation. Curve 160 is the rise of the seed current in the inductor 80 from the power source 32. This seed current provides the flux in the inductor 80 that will be subsequently compressed. The depicted curve 160 transpires over approximately twenty microseconds. Intersection 162 is the activation point of the circuit detonator 110. The capacitive discharge circuit that initiates the circuit detonator 110, is designed to be delayed until the seed current obtains its peak to provide maximum output from the EFCG circuit 40.

Curve 164 is the compression of the seed current that flows through the shorting switch 140 and the final L/3 lag turns 92 of the inductor 80 for the duration of the detonation wave of the circuit detonator 110. The depicted curve 164 transpires over approximately one microsecond, and preferably over less than one microsecond. Intersection 166 is the opening of the shorting switch 140 via the shock wave from the exploding circuit detonator 110. Curve section 170 is the break over of the GDT 150. Curve 172 is the generated high amperage shorted current following break-over of the GDT 150. Point 174 is the activation of the EFI 42, which occurs between approximately thirty nanoseconds and approximately fifty nanoseconds after intersection 166 or opening of the shorting switch 140. Accordingly, the exemplary activation system 30 requires less than approximately twenty-two microseconds from the flux generation portion 50 receiving the first seed current to the subsequent activation of the initiator interface 42.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, stores, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An activation system of a munition for activating a warhead or a propulsion system of the munition, the activation system comprising:
   an initiator interface that activates the warhead or the propulsion system;
   first and second logic elements; and
   a flux compression generator circuit for being powered by a power source and communicatively connected to the logic elements and to the initiator interface;
   wherein activation of the flux compression generator circuit via switching of the logic elements causes current to flow from the flux compression generator circuit to the initiator interface, resulting in activation of the initiator interface and subsequent activating of the respective warhead or propulsion system.

2. The activation system of claim 1, wherein the flux compression generator circuit includes an inductor for receiving current from the power source upon switching of the first logic element, and a circuit detonator for being triggered by the power source to detonate upon switching of both the first logic element and the second logic element, causing shorting of the inductor and increasing current in the inductor.

3. The activation system of claim 1, wherein the initiator interface is an exploding foil initiator.

4. The activation system of claim 1, wherein the flux compression generator circuit further includes a physically-activated shorting switch, and wherein current does not flow from the flux compression generator circuit to the initiator interface until switching of the physically-activated shorting switch.

5. The activation system of claim 4, wherein the physically-activated shorting switch is automatically activated in response to detonation of a portion of the flux compression generator, the detonation being caused by the activation of the flux compression generator.

6. The activation system of claim 2, wherein the flux compression generator circuit further includes a physically-activated shorting switch communicatively coupled between the inductor and the initiator interface, wherein the flux compression generator circuit is configured to cause current to flow from the flux compression generator circuit to the initiator interface upon switching of the physically-activated shorting switch.

7. The activation system of claim 2, further including the power source, coupled to each of the first and second logic elements.

8. The activation system of claim 2,
   wherein the circuit detonator includes explosive material encased by a detonator housing;
   wherein the inductor coil is wrapped about the detonator housing; and
   wherein detonation of the explosive material causes the detonator housing to expand radially outwardly, causing the inductor coil to short and causing current in the inductor coils to increase until the subsequently increased current is released into the initiator interface, thus activating the initiator interface.

9. The activation system of claim 8,
   wherein the inductor coil includes lead turns at a first longitudinal end of the coil and lag turns at a second and opposite longitudinal end of the coil, wherein detonation of the explosive material causes the subsequently increased current to be directed into the lag turns; and wherein the lag turns and the initiator interface are electrically separated by a switch that is switched via explosive force caused by the detonation.

10. The activation system of claim 9, wherein the circuit detonator is disposed radially inwardly of the lead turns of the inductor coil and is longitudinally spaced along a longitudinal coil axis of the inductor coil from the lag turns of the inductor coil.

11. The activation system of claim 2, further including a timing element communicatively connected to the first and second logic elements, and configured to switch the second logic element after a predetermined period of time has passed after the switching of the first logic element.

\* \* \* \* \*